United States Patent [19]
Urda et al.

[11] Patent Number: 5,892,658
[45] Date of Patent: Apr. 6, 1999

[54] VME EUROCARD TRIPLE PRINTED WIRING BOARD SINGLE SLOT MODULE ASSEMBLY

[75] Inventors: Eugene J. Urda, Binghamton; Magid Fazel; Jose R. Caceres, both of Vestal; Daniel G. Rice, Owego, all of N.Y.

[73] Assignee: Lockhead Martin Corporation, Bethesda, Md.

[21] Appl. No.: 76,650

[22] Filed: May 12, 1998

[51] Int. Cl.⁶ ........................................................ H05K 7/20
[52] U.S. Cl. ........................... 361/704; 361/690; 361/715; 361/716; 361/728; 361/730; 361/736
[58] Field of Search ...................... 361/690, 704, 361/694–697, 702, 711, 715–716, 719, 720, 724–733, 736–741, 748, 752, 758, 784, 788, 790, 802

[56] References Cited

U.S. PATENT DOCUMENTS

| | | |
|---|---|---|
| 4,107,760 | 8/1978 | Zimmer . |
| 4,730,232 | 3/1988 | Lindberg ................................. 361/688 |
| 4,771,365 | 9/1988 | Cichocki et al. ....................... 361/705 |
| 4,879,634 | 11/1989 | Storrow et al. . |
| 4,914,259 | 4/1990 | Kobayashi et al. . |
| 4,916,575 | 4/1990 | Van Asten . |
| 5,055,069 | 10/1991 | Townsend et al. . |
| 5,396,401 | 3/1995 | Nemoz . |
| 5,483,420 | 1/1996 | Schiavini . |

Primary Examiner—Leo P. Picard
Assistant Examiner—Borig L. Chervinsky
Attorney, Agent, or Firm—Whitman, Curtis & Whitham

[57] ABSTRACT

A dual-board host or main printed wiring structure of a circuit module with increased component mounting area is made plug-compatible with a backplane to which single-board host or main boards may be attached with connectors of differing dimensions and pin configurations, the center line of which are offset from each other. The connection sides of the two boards are respectively bonded to a heat sink frame structure having a thickness which corresponds to the connector offset on the backplane such that the total thickness of one of the printed wiring boards, the heat sink frame and the two bonding layers with respect to board to center line distances equals the connector offset on a given backplane. Direct connections to both boards of the dual-board structure can thus be made from the backplane to reduce connection length and reliability relating to a mezzanine board mounted on a single-board host. The preferably continuous heat sink frame distributes heat through the structure and to a card cage to avoid hot spots on the printed wiring boards. A mezzanine board and further heat sink may be attached to the dual board host to further increase component mounting area to far greater levels than common industry standards while improving mechanical and electrical integrity and reliability.

25 Claims, 6 Drawing Sheets

VME EUROCARD TRIPLE PRINTED WIRING BOARD SINGLE SLOT MODULE ASSEMBLY

This invention was made with Government support under DAAJ09-97-C-0124 awarded by the Army. This Government has certain rights in this invention.

This application is related to co-pending U.S. patent application attorney docket no. FE00268 (U.S. patent application Ser. No. 09/076,625) filed concurrently herein and incorporated by reference herein in its entirety.

BACKGROUND OF THE INVENTION

1. Field of the Invention

The present invention generally relates to electronic circuit modules which are intended for mounting in a slot of a mechanical structure which provides electrical interconnection thereto and, more particularly, to electronic circuit board modules containing printed wiring boards.

2. Description of the Prior Art

So-called printed circuit boards (PCB) or printed wiring boards (PWB) have been known for many years and may be formed by many techniques (e.g. screening, plating, etching, etc.). Printed wiring boards provide for a compact, structurally robust and easily manufactured electronic circuit structure. Complex interconnection patterns may be formed using multiple metal layers interleaved with insulating layers in the board structure. Discrete electronic components and integrated circuits (or sockets intended to receive connections thereto) are affixed to the boards by soldering leads thereof to metallized pads on a surface of the board or inserting leads through holes in the printed wiring board.

As electronic systems, such as communication systems and data processors, have become more complex, however, the use of multiple printed circuit boards connected to each other has been convenient for accommodating such systems in a compact enclosure or other physical arrangement and limiting the size of printed wiring boards to limit the potential for damage from vibration, impact and the like. Additionally, for ease of maintenance and repair, it has become common to fabricate complex systems in a modular form, often of standardized dimensions and to mount the modules in an interconnection structure which also mechanically supports the printed wiring boards. Such structures may be of various forms referred to as card cages, backplanes, sub-racks and the like. As these arrangements for providing interconnection and mechanical support for the modules have become more fully developed, they have also become largely standardized, placing limits on the size and shape which can be occupied by a module, including a printed wiring board and components mounted on the printed wiring board.

At the same time, functionality and integration density of integrated circuits has increased. Accordingly, the functionality and parts count of such modules has also increased both to exploit commercially available hardware dimensions and to avoid increasing complexity and relative weight of the support and interconnection structure, as would occur if modules were made smaller. Additionally, maintaining constant module size allows systems to be updated as improvements are made in individual modules. Moreover, as circuit cycle and response speeds have increased with increased integration density, increased module functionality allows connection length and signal propagation time within a module to be minimized.

Particularly in this last regard, it has become desirable to further increase module performance while increasing module functionality by further increasing parts count in the modules to the extent possible within the allowed volume of the module. Unfortunately, the limiting factor is generally the area of the printed wiring board that may be accommodated in a module of the mechanical support and interconnection arrangement employed. Efforts to include additional printed wiring boards in a module have usually involved mechanical and/or electrical connection of two boards but which are received in the support structure in the same manner as if the boards were separated and in different modules. U.S. Pat. No. 4,107,760 to Zimmer and U.S. Pat. No. 5,396,401 to Nemoz are typical of such arrangements.

Further, heat dissipation requirements have increased with increased switching speed and functionality as discussed in U.S. Pat. No. 5,483,420 to Schiavini which provides a heat sink plate in a single board module. In this regard, plural boards in a module have often required complex heat sink structures such as that disclosed in U.S. Pat. No. 4,916,575 to Van Asten.

At the present time, a prevalent standard for modular circuit packaging is commonly known as the "Versa Module Europa" (VME) which incorporates a number of design standards including those known in the art as IEEE standard 1101.1, IEEE standard 1101.2, VITA20, ANSI/VITA1, VITA1.1 (VME64X) and IEEE standard P1386.

While these standards allow some degree of freedom in the mechanical design and component layout within the module, all of the standards involved in the collective VME standard are directed to modules including only a single printed wiring board having components mounted on only a single side thereof. The placement of the board in modules in accordance with the VME standard allows a component height of approximately 0.520 inches on one side of the single board while allowing a very low component height/pin protrusion height of approximately only 0.075 inches on the opposite "connection" side of the board. This very limited pin protrusion height precludes mounting of most common integrated circuit components on the connection side of the board. (Modern surface mount technology (SMT) components generally have a height between 0.090 and 0.160 inches.) Therefore, the area available for component mounting is currently a major impediment to increasing module functionality and parts count. By the same token, since the VME standard contemplates only a single board per module and module mounting at 0.800 inch pitch, the volume available for employment of heat removal structures is also quite limited.

It is also known, as discussed in U.S. Pat. No. 4,879,634, to augment the area of the single VME standard board with an additional board known as a mezzanine board. (When a mezzanine board is present, the main board of the VME module is referred to as the "host" board since the mezzanine board essentially plugs into the host board. The term "host" is also used synonymously with "main" board whether a mezzanine board is employed in a module or not.) Input and output (I/O) connections to the mezzanine board from the interconnection structure are made through the host board. This configuration increases the necessary length of connection paths and also places an extra plug and socket or other unsoldered connection arrangement in the signal path which may be a source of noise or signal path discontinuities, possibly intermittent with vibration, acceleration or differential thermal expansion.

Further, while the mezzanine board has been used successfully in many module designs, it can be readily seen that it occupies volume that could otherwise be used for heat removal structures such as heat sinks. Moreover, the mezzanine board is commonly attached to the host board, in accordance with the VME collective standard, such that the component side of the mezzanine board generally faces the component side of the host board and thus tends to aggravate the occurrence of hot spots on the host board. The components on the mezzanine board may interfere with air circulation over the surface of any heat sink which may be provided while the proximity of components on the mezzanine board to the host board provide localized heat input thereto. Modification of such a heat sink may also be required to accommodate components on the mezzanine board and in any case, the area and coverage of the heat sink must be reduced to accommodate connections to the host board.

In summary, a mezzanine board can be used to supplement the area of a single printed wiring board host provided in accordance with the VME standard but is not an ideal solution since its use increases length of signal and power connections, requires connections which are not soldered and interferes with heat sinking of the host board while increasing the likelihood that hot spots will develop on the host board. Further, due to the unsoldered connections, the difficulty of mechanically supporting a mezzanine board, the requirement that connections to the mezzanine board be made through the host board connectors and the volume which is occupied by a mezzanine board, only one mezzanine board can be used with a host board; limiting the total module area to less than twice the host board area. However, the use of a mezzanine board has been the only practical structure to approach the problem of supplementing printed wiring board area within the rules of the VME standard.

The principal reason that the mezzanine board has been the only practical approach to increasing module functionality and parts count is the geometrical configuration of host board connectors in accordance with the VME standard. Specifically, to obtain a sufficient number of contact pins, an entire edge of the VME printed wiring board is populated with connection pins grouped into three connectors. As the VME standard was developed, commercially available edge connectors were employed. Two of the connectors which are adjacent corners of the VME printed wiring board (designated the P1 and P2 connectors) included three or five rows of pins while the central connector (designated P0) included five rows of I/O pins with an additional two rows of ground pins.

As commercial connectors having these configurations were mounted on the component side of the VME printed wiring board, the center line of the central P0 connector was thus offset from the center line of the P1 and P2 connectors (by 1.85 mm or 0.073 inches). This offset also, in time, became part of the VME standard and could not be met by connectors attached to more than one printed wiring board of a module. Therefore, the VME standard could not be met for a second printed wiring board unless connections were provided through a host board, as in the mezzanine board configuration discussed above. No further augmentation of printed wiring board area with additional mezzanine boards is possible for the reasons discussed above and therefore even the non-ideal mezzanine board solution is limited to less than doubling the available area of the host board while presenting further problems which may compromise performance of the module or reliability of a module in severe environmental conditions of vibration, acceleration or thermal excursions.

SUMMARY OF THE INVENTION

It is therefore an object of the present invention to provide a circuit module structure which is plug-compatible with the VME standard while allowing available printed wiring board area in a module to exceed that of a single or double printed wiring board host.

It is another object of the invention to provide a circuit module structure which is plug compatible with the VME or other standard geometry and having improved heat distribution and removal characteristics which avoid hot spots on the host board.

It is a further object of the invention to provide a dual board host structure with direct connections to two or more printed wiring boards in a module which is plug-compatible with the VME standard.

It is yet another object of the invention to provide a circuit module having mounting provisions to include a mezzanine board having improved electrical and thermal performance in combination with a dual board host structure of improved mechanical robustness, thus also presenting a path to exceed doubling (to near tripling) the available area of a standard industry single PWB host.

In order to accomplish these and other objects of the invention, a printed wiring board and heat sink structure comprising first and second printed wiring boards, each having a component side and a connection side is provided. A first bonding layer is provided between the connection side of the first printed wiring board and a first side of a heat sink frame, while a second bonding layer is provided between the connection side of the second printed board and a second side of the heat sink frame. A connection structure on a component side of the first printed wiring board where a mezzanine board connected thereto is also provided. As a further feature of the invention the first and the second printed wiring boards are positioned such that when connectors are mounted to appropriate surfaces of the first and the second printed wiring boards, respectively, center lines of the connectors equal an offset on a backplane to which the connectors are connected thereon.

The connector offset on the backplane equals a total thickness of the second printed wiring board, a thickness of the heat sink frame and thicknesses of the first and the second bonding layers with respect to the first and the second printed wiring board to respective connector center line distances.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figures 1A, 1B:
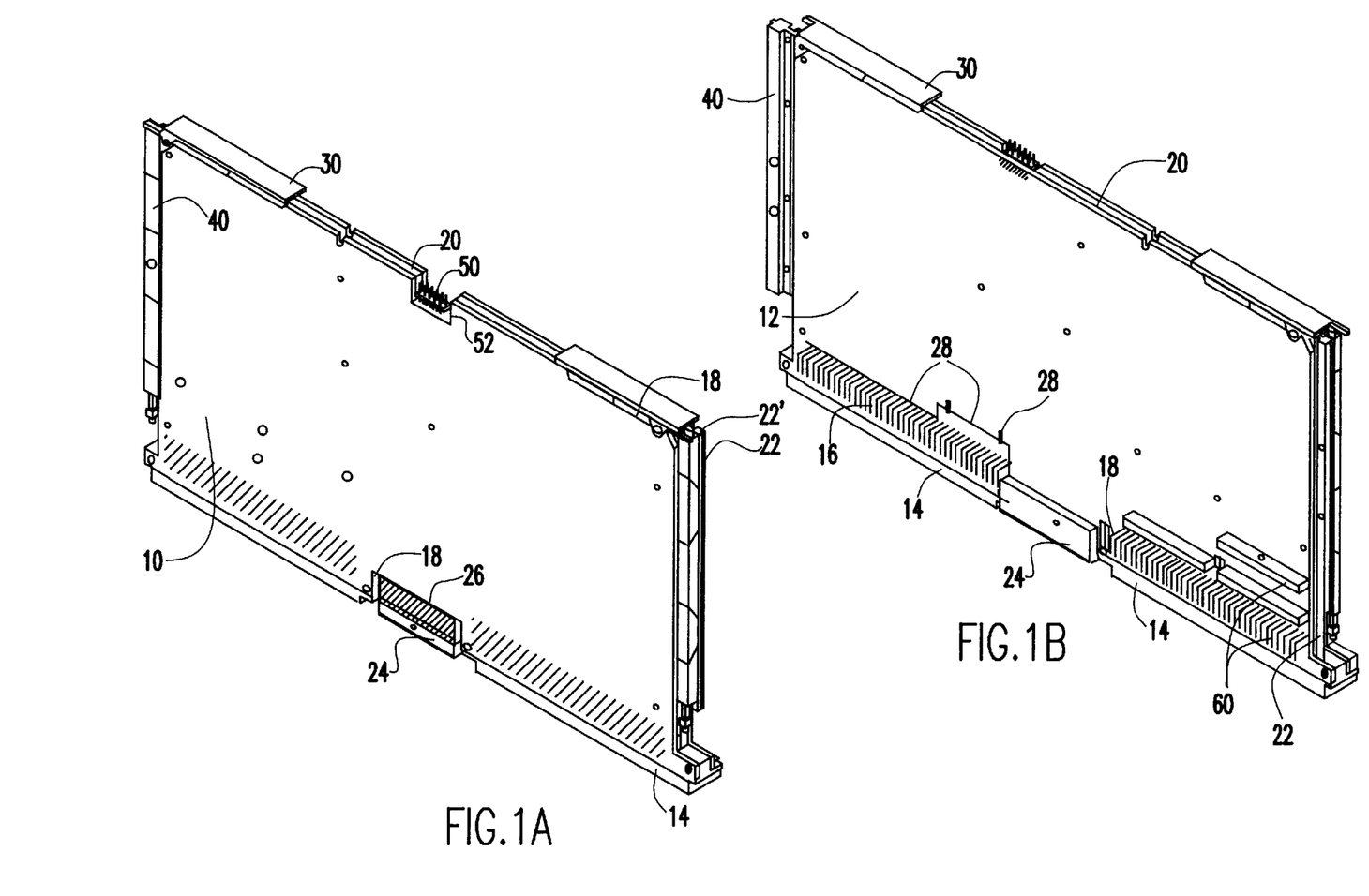
FIGS. 1A and 1B are isometric views of the A and B sides of a dual board (host) module in accordance with the invention, respectively.
Figure 5:
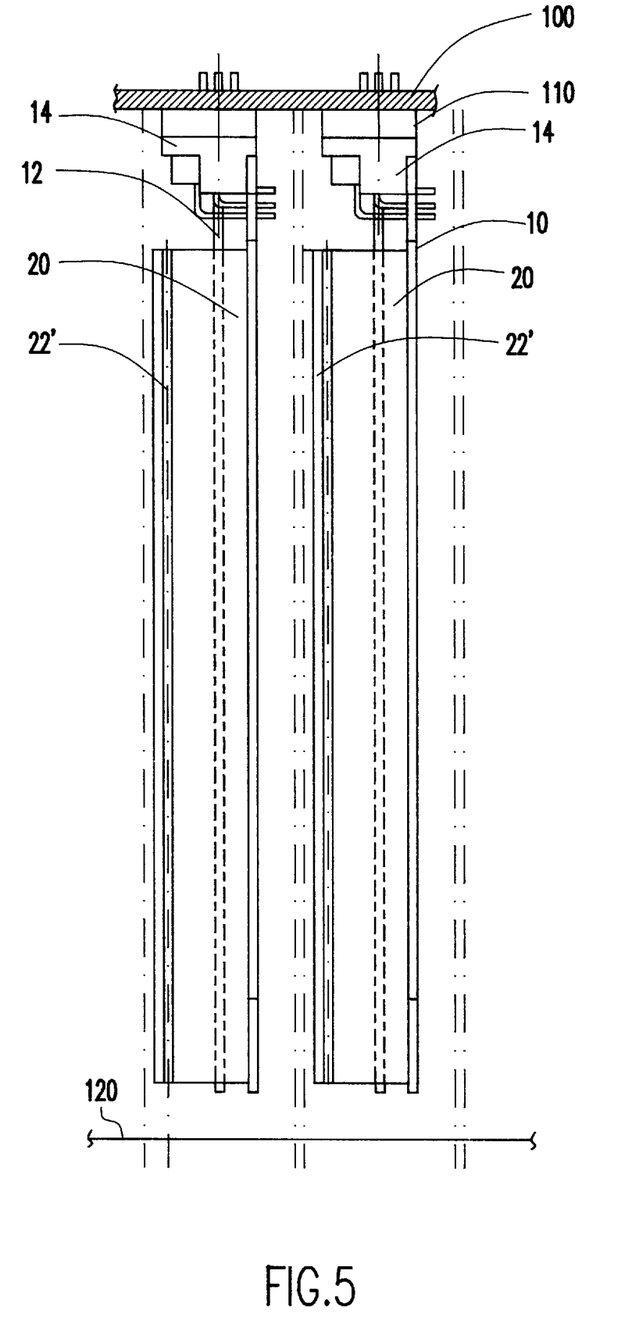
FIG. 5 illustrates mounting of two modules on a support and interconnection structure in accordance with the view of FIG. 2C.

Referring now to the drawings, and more particularly to FIGS. 1A and 1B, there is shown, in isometric view, respective sides of a dual board structure which is plug-compatible with the VME standard in accordance with the invention. The respective sides of the dual-board structure and the boards 10, 12 constituting respective sides of the structure are referred to as the "A" and "B" sides which are respectively visible in FIGS. 1A and 1B. These printed wiring boards 10, 12 have their connection (frame interface) sides bonded (e.g. with a layer of insulating adhesive or an adhesive coated insulating sheet) to a preferably solid and continuous heat sink plate or frame 20 which has ends 22 including ribs 22' which are shaped to fit into slots in a card cage having a backplane 100 (with connectors 110 to receive connectors 14, as shown in FIG. 5), card cage, sub-rack (either being schematically represented at 120 of FIG. 5) or the like preferably in accordance with the collective VME standard discussed above.

Ends 22 are also preferably shaped and include ribs 22' located to provide approximately 0.160 inch component height above the A side board and approximately 0.300 inch component height above the B side board within a standard thickness (e.g. 0.70 inches) leaving a standard clearance (e.g. 0.10 inches) between modules when ribs 221 engage slots in a card cage or sub-rack or the like. However, it should be understood that the respective component heights provided in this manner can be divided in any desired manner but are chosen for convenience of plug alignment, as will be discussed in greater detail below, and since 0.160 inches will accommodate virtually all commercially available flat packs and 0.300 inches is adequate to accommodate most discrete components commonly used in modular circuit constructions. Larger components can be accommodated as necessary within the 0.800 card pitch of the VME standard or any other standard or spacing by cutting apertures in one or both boards 10, 12 and, if both, heat sink 20.

Other preferred mechanical features of the invention include extractor levers 30 cooperating with "wedgelock" expanders to firmly retain the module in a card cage or the like and backplane 100 while providing for ease of removal therefrom without damage to the module or its connectors. A test connector 50 may also be provided on either or both of boards 10, 12 with the other board being notched, as needed, as shown at 52. Crossover connections 18 between boards can also be included and can be permanently made, such as by soldering since the PWBs 10, 12 and heat sink frame 20 are bonded together as a unit. None of these features are at all critical to the practice of the invention and can be omitted, included or modified as desired within the principles of the invention.

As alluded to above, the VME standard was developed from the use of commercially available connectors mounted on a common side of a single board, resulting in a 1.85 mm or 0.073 inch offset in the center line of the central P0 connector relative to the center lines of the P1 and P2 connectors (this 1.85 mm is VME specified). It was also noted above that direct connections from the connectors to each of the respective PWBs in accordance with the invention would avoid the need for additional unsoldered connections required for a mezzanine board and for reducing connection length.

Figure 2A:
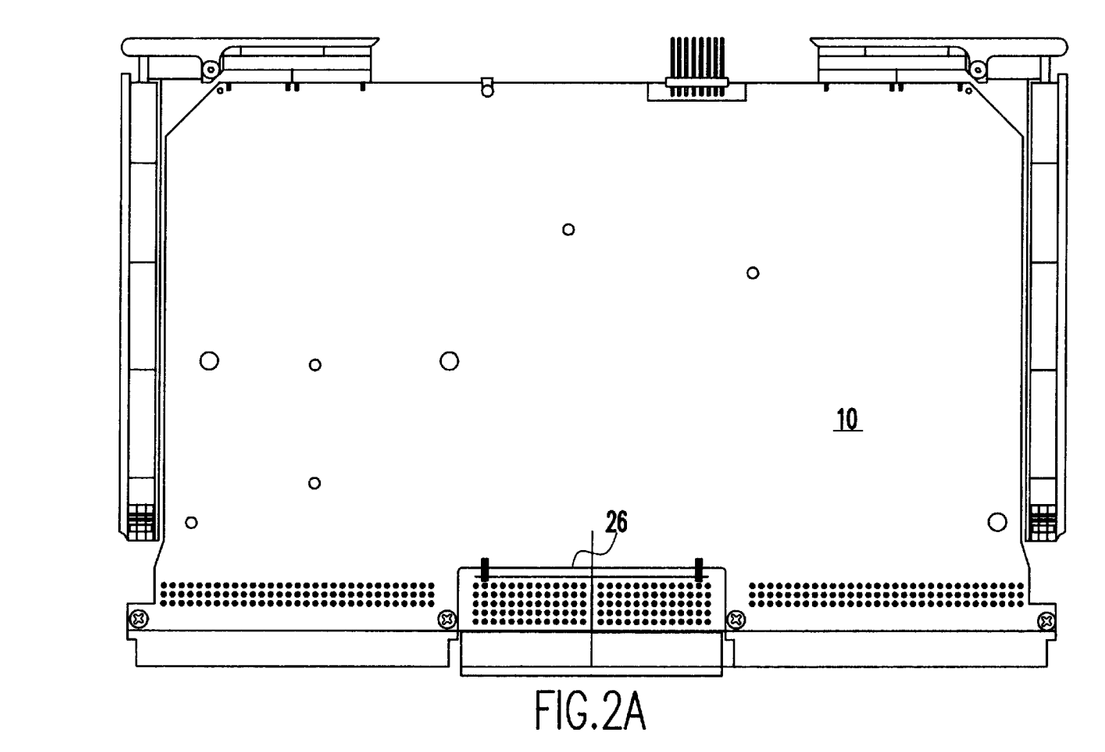
FIGS. 2A, 2B and 2C are plan (side A), side and end views of a dual board (host) module in accordance with the invention, respectively.
Figure 2B:
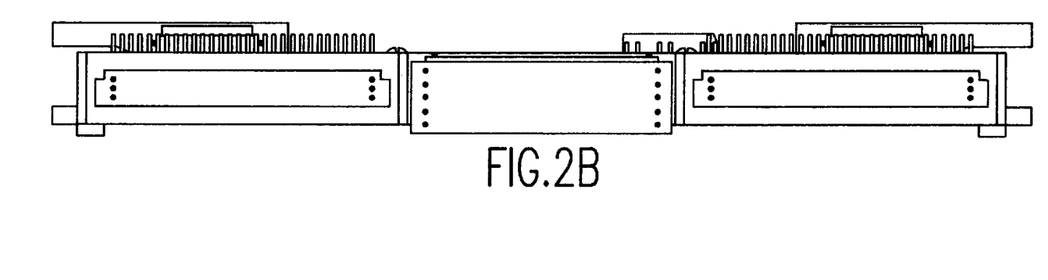
Figure 2C:
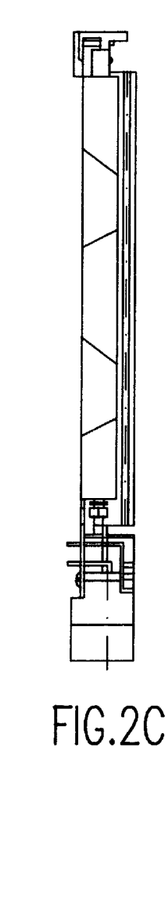
Figure 3A:
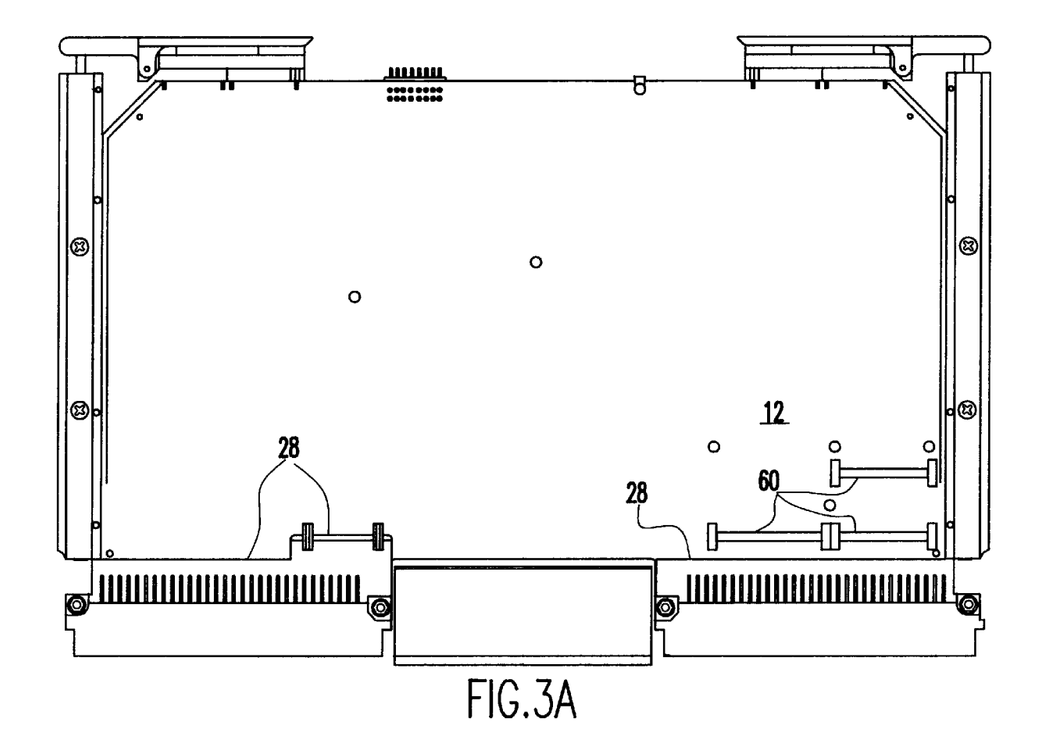
FIGS. 3A and 3B are a plan view of side B and a front/top side view, respectively, of a dual board (host) module in accordance with the invention.
Figure 3B:
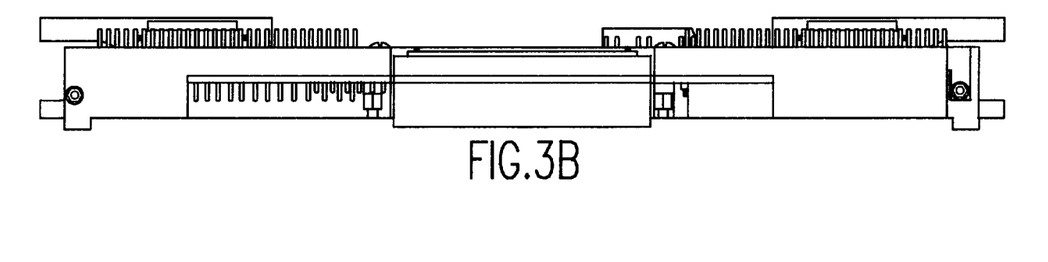

In accordance with the invention, the thickness of the heat sink frame 20, the thickness of board B, 12, and the thickness of the insulating bonds of the boards 10, 12 to the heat sink frame 20 are adjusted, in accordance with the invention, so that when the P1 and P2 connectors 14 are attached to the connection/wiring side of board A, 10, with lead connections 16 and the P0 connector 24 attached to the component side of board B, the center lines of the connectors are respectively offset to match a desired standard, such as the VME standard, and thus achieve plug-compatibility with the backplane in accordance with the same standard while providing direct connections to both boards 10, 12, as shown in FIGS. 2B, 2C and 3B. For the preferred VME standard, a heat sink frame thickness of 0.076 inches in the PWB areas, a bond thickness of 0.004 inches and a board B thickness of 0.061 inches is preferred while allowing use of commercially available connectors.

That is, the total thickness of the heat sink frame, two bonds to the boards 10, 12, the thickness of board B, 12, and the distance from board B component side surface to connector center line of connector 24 (since connector 24 is placed on the component side of board B, opposite the heat sink frame) less the distance from board A connection side surface to connector center line of connectors 14 (since they are placed on the connection side of board A, 10, as opposed to the component side in accordance with the VME standard) equals the desired offset of the center lines of the connectors (0.073 inches (1.85 mm) in the VME standard) that exists between the connectors on backplane 100. Put another way, the total thickness of board B, 12, the thickness of the heat sink frame and the two bonding layers with respect to both board A and board B connector center line distances equals the connector offset on backplane 100 and thus matches the offset which would occur if the connectors 14 and 24 were mounted on the same surface of a single printed wiring board (which is the industry standard). In other words, the first and the second printed wiring boards are positioned such that when connectors are mounted to appropriate surfaces of the first and the second printed wiring boards, respectively, center lines of the connectors equal an offset on a backplane to which the connectors are connected thereon.

The above thicknesses and their relationships are illustrated in FIG. 5. The heat sink frame thickness, if fabricated of a material having relatively good thermal conductivity such as copper or aluminum, has been found adequate to provide enhanced thermal performance and avoidance of hot spots by being sufficiently conductive of heat to maintain substantially uniform temperature and uniform heat spreading across both boards as well as to conduct heat to the card cage through edges 22.

It should be noted that while standard commercially available connectors are used for the P1 and P2 connectors 14, their pin numbers must be rotated 180° (at the board design level) since they are mounted on the connection side of PWB A, 10, rather than the component side as in the VME standard. A similar rotated pin labeling scheme applies to the P0 connector, being that it is mounted to a wholly different board. Mechanical keying of the connectors, if used, must also be similarly rotated. However, it should be understood that pin numbering, keying and the side of the board on which a given connector is intended to be mounted is largely a matter of convention or labeling and custom connectors could also be used.

Figure 4:
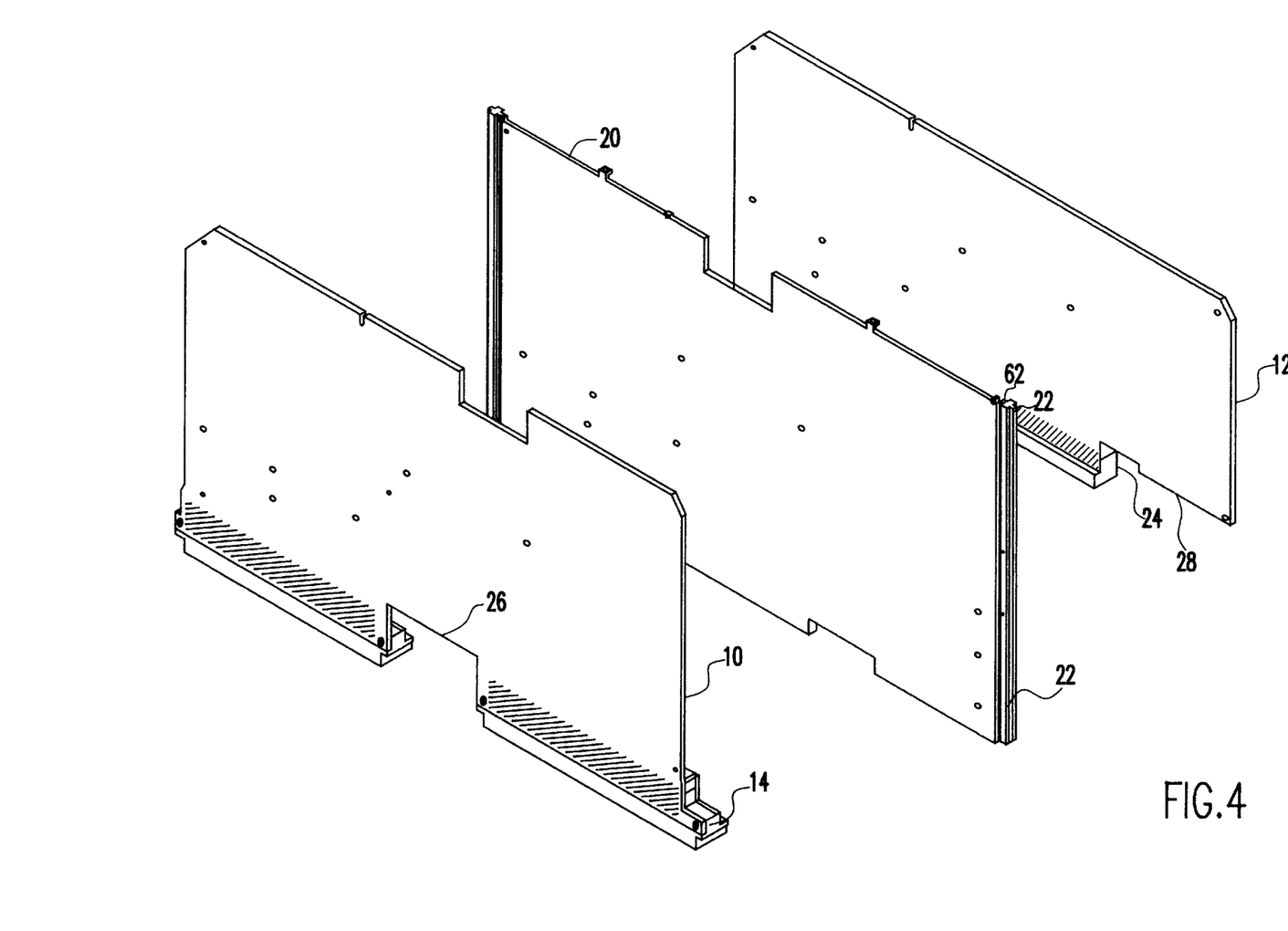
FIG. 4 is an exploded isometric of a dual board module corresponding to the view of FIG. 1A.

For example, connector 24 overlaps the edge of board 12 as best illustrated in FIG. 4 is mounted on the component side of the board 12 as is intended by the manufacturer. However, connectors 14 are intended to be mounted on the component side of the same board but are mounted on the connection side of board 10 in accordance with the invention. However, a commercially available or custom connector could be used which was intended for connection to the connection/wiring side of the PWB which would, for that reason, already include the rotation of pin numbers and keying.

It should also be noted that boards 10 and 12 are sized and notched, as illustrated at 26, 28, respectively, of FIGS. 2A, 3A and, particularly, the exploded view of FIG. 4, to provide clearance for the mounting of connectors 14 and 24. (Depending on connection requirements, however, connector 24 may not be required on all modules.) These connectors may be mechanically attached to the board and heat sink laminated "sandwich" structure by any desired method which provides adequate strength. The use of small bolts, as illustrated, is preferred to transfer forces (e.g. during insertion and removal from backplane 100 and connector 110) to the heat sink frame 20.

In view of the foregoing, it is seen that the invention including a dual board laminated structure provides plug-compatibility with existing module dimension standards such as the VME standard while providing a structurally robust structure of improved electrical reliability and performance and much increased thermal performance and freedom from hot spots while effectively doubling the board area for mounting of components on the host circuit or main card.

Figure 6:
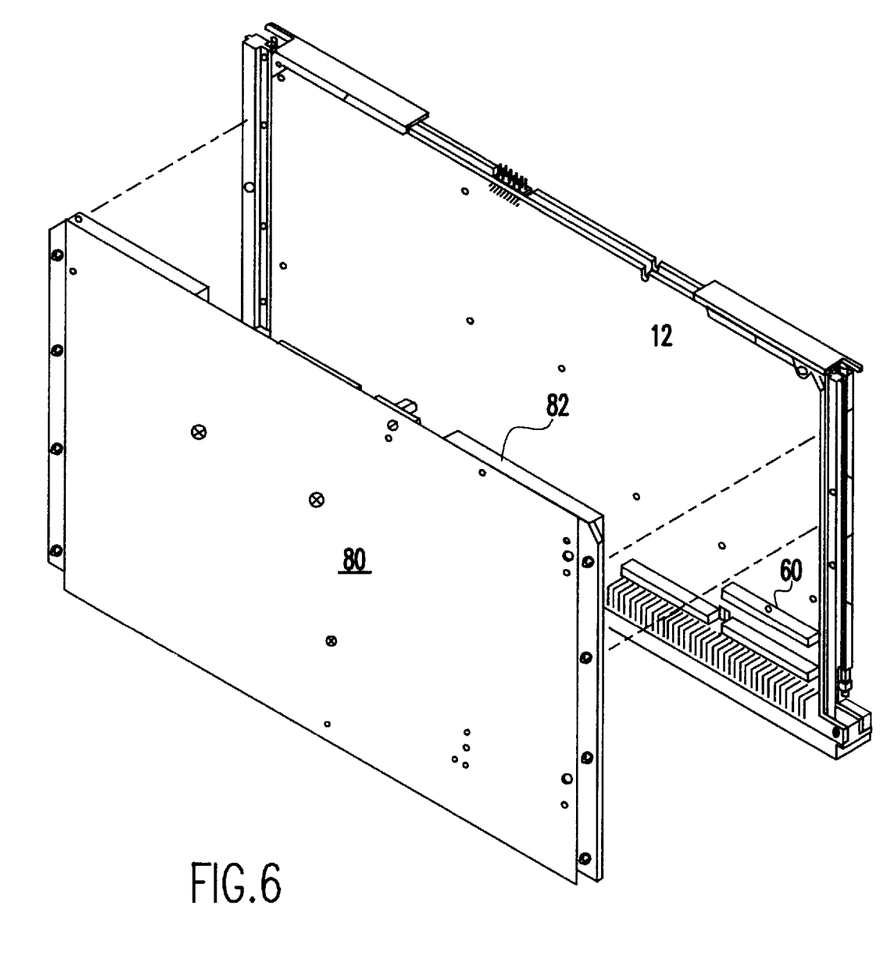
FIG. 6 is an exploded isometric view of a preferred form of a mezzanine board mounting on the dual board host module of FIG. 1A.

Further in accordance with the invention and as shown in exploded form in FIG. 6, the board area of the module can be further increased by the inclusion of a mezzanine board. However, in contrast with the installation of a mezzanine board on a single board host, mounting on a dual board host in accordance with the invention also provides further electrical, mechanical and thermal advantages over known mezzanine board constructions.

Specifically, as best shown in FIG. 4, ends 22 of heat sink frame 20 are offset from the surfaces to which boards 10, 12 are bonded to provide the component clearances discussed above in accordance with protrusions which engage a card cage or the like. Ends 22 are also preferably formed with a notched inner edge against which a mezzanine board 80 or a heat sink 82 can be directly seated. This structure provides additional structural support for the mezzanine board as well as additional thermal distribution and heat removal capacity. Connections between the mezzanine board and the dual board host by VME industry standard connectors 60 is also made more robust since relative movement of the unsoldered connections therein, especially if bolted, as preferred and illustrated, is prevented. Also to maximize volume usage and availability, it is preferred that the component side of the mezzanine board face the host board structure to allow the components to be "skylined" against the component locations on the host board. This orientation provides additional protection for components mounted thereon when the module is removed from the card cage and allows the plug and socket connection to be mounted on the component side of the mezzanine board for convenience of manufacture.

In view of the foregoing, it is seen that the invention provides a structure in which the available board area available for mounting of components can be doubled or tripled while enhancing mechanical, electrical and thermal performance of a module. It should also be appreciated that while connections are made from board A 10 to the mezzanine board, by virtue of crossover connections 18 (which also serve to minimize wiring length within the module), all three connectors P0, P1 and P2 are available for connections to the mezzanine board as in single board hosts. Therefore, the invention is fully compatible with the VME standard in this regard, as well, and provides increased flexibility of design of both module wiring and backplane interconnection wiring.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A printed wiring board and heat sink structure comprising
   first and second printed wiring boards, each having a component side and a connection side,
   a heat sink frame of thermally conductive material,
   a first bonding layer between said connection side of said first printed wiring board and a first side of said heat sink frame,
   a second bonding layer between said connection side of said second printed board and a second side of said heat sink frame,
   a connection structure on a component side of said second printed wiring board, and
   a mezzanine board connected to said connection structure of said second printed wiring board
   wherein said first and said second printed wiring boards are positioned such that when connectors are mounted to appropriate surfaces of said first and said second printed wiring boards, respectively, center lines of said connectors equal an offset on a backplane to which said connectors are connected thereon.

2. A structure as recited in claim 1, wherein said connectors include
   a first connector mounted on said connection side of said first printed wiring board, and
   a second connector mounted on said component side of said second printed wiring board.

3. A structure as recited in claim 2, wherein said connectors further include
   a third connector mounted on said connection side of said first printed wiring board.

4. A structure as recited in claim 1, wherein said connector offset on said backplane equals a total thickness of said second printed wiring board, a thickness of said heat sink frame and thicknesses of said first and said second bonding layers with respect to said first and said second printed wiring board to respective connector center line distances.

5. A structure as recited in claim 1, further including
   an electrical crossover connection between said first printed wiring board and said second printed wiring board.

6. A structure as recited in claim 1, wherein an edge of said first printed wiring board is dimensioned to provide a clearance for one of said connectors.

7. A structure as recited in claim 2, wherein an edge of said first printed wiring board is dimensioned to provide a clearance for said second connector.

8. A structure as recited in claim 7, wherein an edge of said second printed wiring board is dimensioned to provide a clearance for said first connector.

9. A structure as recited in claim 1, wherein said connector offset is approximately 0.073 inches.

10. A structure as recited in claim 2, wherein said connector offset is approximately 0.073 inches.

11. A module as recited in claim 1, wherein said first and second printed wiring boards and said mezzanine board are located at said single slot location on said backplane.

12. A circuit module for connection to a backplane comprising
   first and second printed wiring boards, each having a component side and a connection side and having circuit components mounted on respective component sides thereof,
   a heat sink frame of thermally conductive material,
   a first bonding layer between said connection side of said first printed wiring board and a first side of said heat sink frame,
   a second bonding layer between said connection side of said second printed wiring board and a second side of said heat sink frame,
   a connection structure on a component side of said second printed wiring board, and
   mezzanine board connected to said connection structure of said second printing wiring board
   wherein said first and said second printed wiring boards are positioned such that when connectors are mounted to appropriate surfaces of said first and said second printed wiring boards, respectively, center lines of said connectors equal an offset on a backplane to which said connectors are connected thereon.

13. A module as recited in claim 12, wherein said connectors include
   a first connector mounted on a connection side of said first printed wiring board,
   a second connector mounted on said component side of said second printed wiring board.

14. A module as recited in claim 13, wherein said connectors further include
   a third connector mounted on said connection side of said first printed wiring board.

15. A module as recited in claim 12, wherein said connector offset on said backplane equals a total thickness of said second printed wiring board, a thickness of said heat sink frame and thicknesses of said first and said second bonding layers with respect to said first and said second printed wiring boards to said respective connector center line distances.

16. A module as recited in claim 12, further including
   an electrical crossover connection between said first printed wiring board and said second printed wiring board.

17. A module as recited in claim 12, wherein an edge of said first printed wiring board is dimensioned to provide a clearance for one of said connectors.

18. A module as recited in claim 13, wherein an edge of said first printed wiring board is dimensioned to provide a clearance for said second connector.

19. A module as recited in claim 18, wherein an edge of said second printed wiring board is dimensioned to provide a clearance for said first connector.

20. A module as recited in claim 12, wherein said connector offset is approximately 0.073 inches.

21. A module as recited in claim 12, further including
   means for mechanically attaching said heat sink to said mezzanine board.

22. A module as recited in claim 12, further including
   means for attaching said mezzanine board to a heat sink plane.

23. A module as recited in claim 21, further including
   means for attaching said mezzanine board and said heat sink to a heat sink plane.

24. A module as recited in claim 12, wherein said first and second printed wiring boards and said mezzanine board occupies said single slot location on said backplane.

25. A module as recited in claim 24, wherein on said backplane has an approximately 0.800 inch card slot pitch.

* * * * *

UNITED STATES PATENT AND TRADEMARK OFFICE
CERTIFICATE OF CORRECTION

PATENT NO. : 5,892,658
DATED : April 6, 1999
INVENTOR(S) : Eugene J. Urda, Magid Fazel, Jose R. Caceres, Daniel G. Rice It is certified that error appears in the above-identified patent and that said Letters Patent is hereby corrected as shown below:

Title page,
Change Assignee "Lockhead Martin Corporation" to read -- Lockheed Martin Corporation --

Signed and Sealed this

Nineteenth Day of March, 2002

Attest:

JAMES E. ROGAN
*Attesting Officer*  *Director of the United States Patent and Trademark Office*